May 18, 1965 T. W. KISOR 3,184,056

PACKAGES FOR ELECTRONIC AND OTHER COMPONENTS

Filed Nov. 21, 1960

INVENTOR.
THADDEUS W. KISOR
BY Morris A. Rabkin
ATTORNEY 3,184,056

PACKAGES FOR ELECTRONIC AND OTHER COMPONENTS

Thaddeus W. Kisor, Flemington, N.J., assignor to Radio Corporation of America, a corporation of Delaware Filed Nov. 21, 1960, Ser. No. 70,456
6 Claims. (Cl. 206—65)

Figures 1, 2, 3:
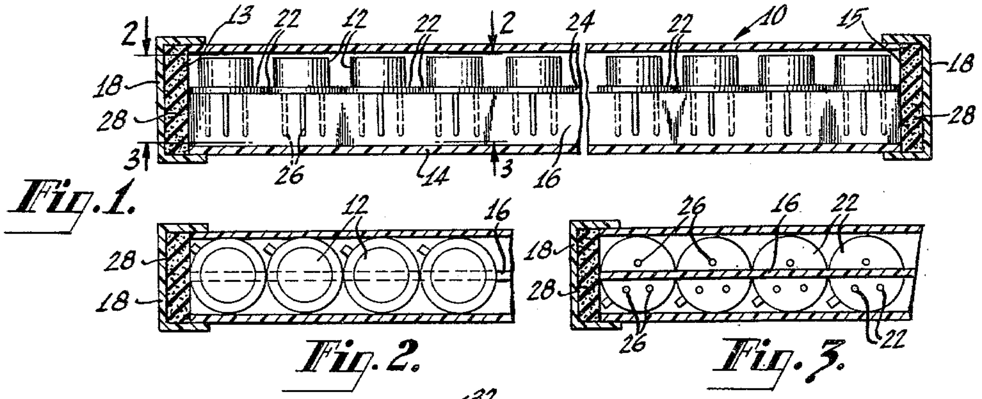

This invention relates to packages for electronic and other components, and more particularly to storage containers comprising magazines or cartridges in which the components can be packaged and from which such components can be fed to component handling apparatus.

In the manufacture of electronic apparatus, it has become common practice to use printed circuit boards on which various electronic components are mounted. These components usually have two or more terminal leads by means of which they are connected to other components or circuitry on the boards. Automatic apparatus is frequently used for applying such components to the printed circuit boards or to other supports. In many cases, the components must be oriented in a particular manner to insure application thereof in proper relation to other parts of the assembly. Thus, it is desirable not only to facilitate supplying or feeding the components to the component aplying apparatus, but also to insure that they will be fed thereto in properly oriented position.

The primary object of the present invention is to provide an improved package for electronic and other components which is particularly suited for use with component handling equipment.

More particularly, it is an object of this invention to provide an improved container in which electronic and other components can be packaged for storage and shipping, and which can also serve as a cartridge or magazine useful in supplying individual components to component applying apparatus.

It is still another object of this invention to provide an improved package for electronic and other components comprising a container in which the components can be arranged and maintained in oriented relation.

It is still another object of this invention to provide an improved container for electronic components which is capable of packaging components having different arrangements of terminal leads.

It is another object of this invention to provide an improved container for various components which allows for easy loading of the components into and unloading of the components from the container.

It is also an object of this invention to provide an improved container for various components which allows a minimun of contact between the packaged components.

It is another object of this invention to provide an improved container for various components which allows for packaging a large number of components in a minimum amount of space.

It is still a further object of this invention to provide an improved container for various components which is simple and economical to manufacture, which has great strength, and which is highly efficient in use.

According to the invention, there is provided an elongated, open-ended, tubular container which is preferably, though not necessarily, extrusion molded in one piece. The container is provided on the inner surface thereof with a longitudinally extending rib constituting a rail member for supporting the bodies of components stored therein. The rail member is so positioned that the components will rest thereon and be supported thereby. Electronic components, for example, with a wide variety of terminal lead arrangements can be stored in such a container. By causing the leads to straddle the rail in predetermined manner, the components can be arranged with a desired orientation. Components can be loaded easily into the container through either open end thereof. A shock absorbing cap member may be positioned over each end of the tubular member for confining the components within the tubular member during shipment.

The tubular package thus provided constitutes a magazine or cartridge which is adapted for easy unloading by aligning the rail member in the package with a rail of similar size in a utilization device and inclining the package so that the components will slide down the rail member and onto the rail. The package can also be easily unloaded by inserting a plunger type member through the opening at one end of the package and forcing the components out through the opposite end of the package onto an aligned rail. Loading and unloading of the package can also be accomplished with the aid of a suitable vibrator device acting on the container.

According to another form of this invention, the container is provided with a number of rail members arranged in parallel relation along the base thereof so that a large number of components can be stored in one container.

Figure 4:
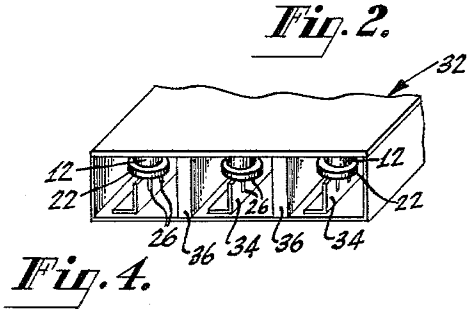
Figure 5:
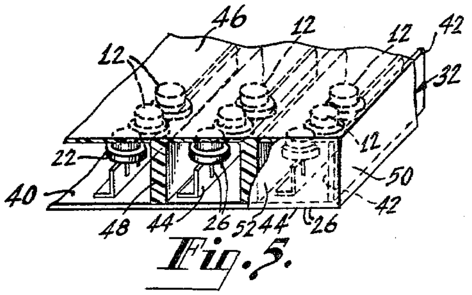
Figure 6:
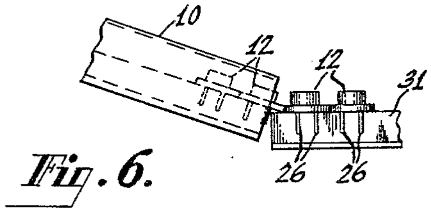
Figure 7:
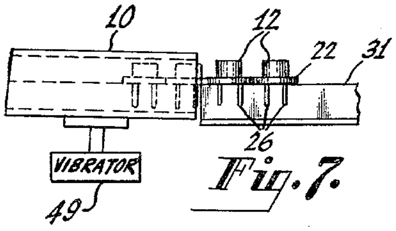
Figure 8:
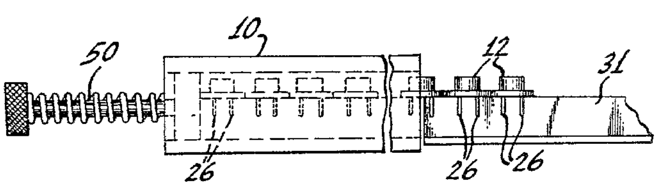
Figure 9:
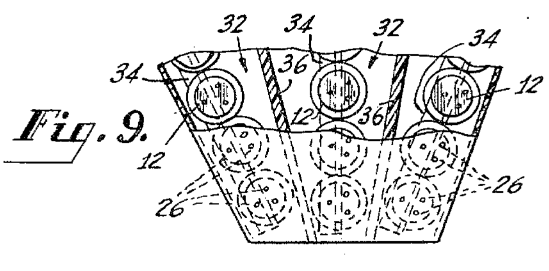

The novel features of this invention, both as to its organization and method of operation, as well as additional objects and advantages thereof, will be more fully understood from the following description, when read in connection with the accompanying drawing in which:

FIG. 1 is a longitudinal, cross sectional view of one form of package according to the present invention, the container thereof being shown filled with transistors having three terminal leads by way of example, FIG. 2 is a cross sectional, fragmentary view taken along the line 2—2 of FIG. 1, FIG. 3 is a cross sectional, fragmentary view taken along the line 3—3 of FIG. 1, FIG. 4 is a fragmentary, perspective view of another form of package according to the present invention with the end cap removed from one end of the container, FIG. 5 is a view similar to FIG. 4 of still another form of package according to the invention, this form having a removable top, and a number of electronic components being shown mounted on each of the several rail members of this form of package, FIG. 6 is a side elevational view of an inclined container of the form shown in FIGS. 1 to 3, the container being aligned at its discharge end with an unloading ridge, FIG. 7 is a side elevational view similar to FIG. 6 but showing the container disposed on a vibrator and aligned with an unloading rail, FIG. 8 is a side elevational view of a package such as shown in FIG. 1 with a plunger type component advancing member extending into one end of the container and with the other end of the container adjacent an unloading rail with which the rail member of the container is aligned, and FIG. 9 is a fragmentary, top plan view of a further form of package according to the invention, the top of this package being partly broken away.

Referring, now, more particularly to FIGS. 1, 2 and 3 of the drawing, there is shown a container 10 for electronic components 12, such as transistors, for example, the container 10 including a body 14, a pair of end caps 18, and a rail member 16 in the body 14.

The body 14 is preferably formed in the shape of an elongated tube and preferably of rectangular cross section, the tube being open at each of its ends 13 and 15 so that the components 12 can be loaded into and unloaded from the container at either end. Located within the body 14 is a preferably off-centered rail member 16 which extends longitudinally therealong from one end 13 thereof to the other end 15. The body 14 and rail member 16 may be extruded or molded in one integral piece from any suitable ceramic material or from a suitable plastic material such as a butyrate or an acetate, or they may be molded separately and the rail member 16 cemented in place on the base or floor of the tubular body 14. The rail member 16 projects upwardly approximately one-half the height of the tubular body 14 so that the base 22 of a transistor 12 or other electronic component can rest on the upper edge 24 of the rail member 16 to be supported thereby. The leads 26 of the components 12 straddle the rail member 16 so that at least one of the leads 26 is on one side of the rail member 16 and one or more on the other side thereof depending on the number of leads the component has. In this way, the components 12 can be properly oriented or polarized within the container. The rail member 16 may be somewhat off-center, if necessary, so that the leads can be accommodated properly.

Positioned over each end of the body 14 during shipment or storage is a cap or other suitable closure 18 which, in the case of a cap, is U-shaped and can be more accurately described as a snap cap inasmuch as the ends of the U-shaped member snap over the outer surface of the tubular body. Secured within each of the caps is a piece of shock absorbing material 28, such as rubber, which absorbs shock when the electrical components 12 strike the caps during shipment.

Referring, now, to FIG. 4 of the drawing, there is shown a package having a tubular member capable of receiving a large number of components 12 in one container 32. The container 32, as shown in FIG. 4, is formed with a number of longitudinally extending, substantially parallel, spaced rail members 34 separated by walls 36 which can be an integral part of the container, thereby making the volume adjacent each rail member a separate compartment. The components 12 are positioned on the rail members 34 in the same manner as described in relation to FIGS. 1 to 3 to be supported thereon. An elongated, U-shaped cap, similar to the caps 18 illustrated in FIG. 1, can be fitted over each end of the multiple compartment container 32 during shipment or storage in order to retain the components 12 therein.

The container 32 illustrated in FIG. 5 has a base 40 and a pair of sides 42 (only one side being shown). Affixed to the base 40 are a plurality of longitudinally extending, substantially parallel, spaced component supporting rail members 44 which are of sufficient height to support the transistors 12 thereon at their bases 22 with the transistor leads 26 straddling the rail members 44 but not coming in contact with the base 40. During shipment, a top 46 is placed on the sides 42 of the multiple container 32. The top is formed with pairs of side and end members 50 and 52, respectively (only one of each being shown for the sake of simplicity), and a number of substantially parallel partitions 48 which extend perpendicularly to the base 40 and contact it adjacent each rail member in alternating relation with the respective rail members so that the volume surrounding each rail member is made into a separate or discrete compartment.

In order to unload the container 10, one of the three methods illustrated in FIGS. 6, 7 and 8 may be utilized. In FIG. 6, one of the end caps 18 is removed from the body 14 which is then tilted to an angle such as to cause the components 12 contained therein to slide down the rail member 16 and onto a rail 31 of a utilization device, such as a component applying machine, the rail 31 being aligned with the rail member 16. The components 12 can then be moved along the rail 31 to an operating station of the machine. As shown in FIG. 7, the container 10 is placed on a vibrator device 49 with its rail member 16 in alignment with the rail 31, the container being tilted slightly so that, when the container 10 is vibrated, the components 12 will slide down the rail member 16 and onto the rail 31.

FIG. 8 illustrates still another method of forcing the transistors out of the container during the unloading operation. In this case, as in FIGS. 6 and 7, the rail member 16 in the container 10 is aligned with the rail 31, but the container 10 is maintained horizontal and a spring controlled plunger member 50 is inserted through the far end of the container to force the components 12 out through the near end of the container and onto the rail 31.

From the foregoing description, it will be apparent that I have provided an improved magazine or cartridge type of package for electronic components. While I have illustrated and described several forms of container, it will, no doubt, be apparent to those skilled in the art that various changes may be made in the particular forms disclosed and that other forms are possible, all within the spirit of the present invention. For example, in the multi-compartment containers of FIGS. 4 and 5, the rail members 34 and 44 could be angularly related to each other in fan-like fashion, as in FIG. 9, for better accommodation of the cartridges to certain utilization devices wherein a plurality of rails 31 may be similarly disposed. Moreover, although the invention has been described primarily with reference to electronic components, it should be readily apparent that the package of this invention is adaptable for many other articles, such as small pieces of hardware (for example, split rivets, upholstery tacks, and the like). Hence, I desire that the foregoing shall be taken merely as illustrative and not in a limiting sense.

What is claimed is:

1. The combination of a tubular container and a plurality of transistors each having a body portion and at least two dependent legs, said container having a top, a base and sides and being normally open at both ends, said ends being closed by closure members, at least one supporting rail fixed to said base between said sides and extending longitudinally along said base, said rail extending vertically from said base toward said top and terminating short of said top, each transistor being located in said container with the body portion of the transistor resting on and in sliding contact with the top edge of said rail and with the legs of said transistor straddling said rail, the height of said rail being greater than the length of said legs whereby the ends of said legs are positioned above and out of contact with said base and whereby said transistors may be slid along said rail.

2. The combination according to claim 1 in which said sides are fixed to said top and rest on said base.

3. The combination according to claim 1 in which said rail is positioned off-center with respect to said sides.

4. The combination according to claim 1 in which said sides and said rail are angularly related to each other in fan-like fashion.

5. The combination according to claim 1 in which there are at least one partition and at least two rails spaced from each other and from said sides across the width of said container, said partition and said rails being alternately positioned with respect to each other.

6. The combination according to claim 1 and including a spring-controlled plunger member inserted into one open end of said container for forcing said transistors out of the other end of said container.

References Cited by the Examiner

UNITED STATES PATENTS

| | | | |
|---|---|---|---|
| 2,250,303 | 7/41 | Katz | 206—56 |
| 2,757,792 | 8/56 | Shioleno | 206—65 |
| 2,949,182 | 8/60 | Williams | 206—65 |
| 2,964,229 | 12/60 | Mansfield | 206—65 X |
| 2,984,344 | 5/61 | Weissman | 206—65 X |

THERON E. CONDON, *Primary Examiner.*

EARLE J. DRUMMOND, *Examiner.*